(12) United States Patent
Chern

(10) Patent No.: US 11,362,097 B1
(45) Date of Patent: Jun. 14, 2022

(54) ONE-TIME PROGRAMMABLE MEMORY DEVICE AND FABRICATION METHOD THEREOF

(71) Applicant: HeFeChip Corporation Limited, Sai Ying Pun (HK)

(72) Inventor: Geeng-Chuan Chern, Cupertino, CA (US)

(73) Assignee: HeFeChip Corporation Limited, Sai Ying Pun (HK)

( * ) Notice: Subject to any disclaimer, the term of this patent is extended or adjusted under 35 U.S.C. 154(b) by 28 days.

(21) Appl. No.: 17/110,333

(22) Filed: Dec. 3, 2020

(51) Int. Cl.
| | |
|---|---|
| *G11C 16/04* | (2006.01) |
| *H01L 27/112* | (2006.01) |
| *H01L 21/265* | (2006.01) |
| *G11C 17/06* | (2006.01) |

(52) U.S. Cl.
CPC ........ *H01L 27/11206* (2013.01); *G11C 17/06* (2013.01); *H01L 21/26513* (2013.01); *H01L 21/26586* (2013.01)

(58) Field of Classification Search
CPC ............... G11C 17/06; H01L 27/11206; H01L 21/26513; H01L 21/26586
See application file for complete search history.

(56) References Cited

U.S. PATENT DOCUMENTS

| | | | |
|---|---|---|---|
| 7,872,898 B2* | 1/2011 | Ching | G11C 17/16 365/96 |
| 11,250,924 B1* | 2/2022 | Lee | G11C 17/18 |
| 2009/0296448 A1* | 12/2009 | Hsueh | G11C 5/00 365/189.11 |
| 2012/0223299 A1* | 9/2012 | Liu | H01L 27/10 257/43 |

\* cited by examiner

*Primary Examiner* — Pho M Luu
(74) *Attorney, Agent, or Firm* — Winston Hsu

(57) ABSTRACT

A semiconductor memory device includes at least an OTP cell having a transistor and a PN junction diode. The OTP cell further includes a substrate having a first conductivity type, and a source and a drain in the substrate. The source includes a source doping region having the first conductivity type. The drain includes a drain doping region having a second conductivity type opposite to the first conductivity type. A gate is disposed on the substrate between the source and the drain. The source further includes a pocket doping region having the second conductivity type under the gate. The pocket doping region and the source doping region constitute the PN junction diode.

17 Claims, 10 Drawing Sheets

ONE-TIME PROGRAMMABLE MEMORY DEVICE AND FABRICATION METHOD THEREOF

BACKGROUND OF THE INVENTION

1. Field of the Invention

The present disclosure relates to a semiconductor memory device. More particularly, the present disclosure relates to a one-transistor one-diode (1T1D) one-time programmable (OTP) memory device and a method for fabricating the same.

2. Description of the Prior Art

One-time programmable (OTP) memory devices that contain electrical fuse are known in the art. To program the OTP memory device, a high voltage can be applied to induce a high current to flow through the electrical fuse of the OTP memory device such that the OTP memory device can be programmed or burned into a high or low resistance state (depending on either fuse or anti-fuse). Typically, the electrical fuse is a programmable resistive device that can be constructed from a segment of interconnect such as polysilicon.

However, the prior art OTP memory device utilizing PN polysilicon junctions or PN single crystalline silicon junctions require complicate layouts and circuit, and the manufacturing method for making the prior art OTP memory device is complex.

SUMMARY OF THE INVENTION

It is one objective of the present disclosure to provide an improved semiconductor memory device, as well as method of fabricating same, to solve the deficiencies or shortcomings of the above-mentioned prior art.

One aspect of the present disclosure provides a semiconductor memory device, comprising at least one OTP cell including a transistor and a diode. The diode is a PN junction diode that is electrically coupled to a source of the transistor. The OTP cell further comprises: a substrate having a first conductivity type. The source is disposed in the substrate and comprises a source doping region having the first conductivity type. A drain is disposed in the substrate and is spaced apart from the source. The drain comprises a drain doping region having a second conductivity type opposite to the first conductivity type. A gate is disposed on the substrate between the source and the drain. The source further comprises a pocket doping region having the second conductivity type under the gate. The pocket doping region and the source doping region constitute the PN junction diode.

According to some embodiments, the semiconductor memory device further comprises: a gate dielectric layer disposed between the gate and the substrate, wherein a breakdown voltage of the gate dielectric layer is higher than a breakdown voltage of the PN junction diode.

According to some embodiments, the first conductivity type is P type and the second conductivity type is N type.

According to some embodiments, the source doping region is a $P^+$ doping region and the drain doping region is an $N^+$ doping region, and wherein the pocket doping region is an N-type doping region.

According to some embodiments, the drain doping region is electrically connected to a bit line, and wherein the source doping region is electrically connected to the substrate.

According to some embodiments, the source doping region has a junction depth that is deeper than that of the pocket doping region.

Another aspect of the invention provides a method for programming a semiconductor memory device. The semiconductor memory device comprises: a substrate having a first conductivity type; a source in the substrate, wherein the source comprises a source doping region having the first conductivity type; a drain in the substrate and spaced apart from the source, wherein the drain comprises a drain doping region having a second conductivity type opposite to the first conductivity type; and a gate disposed on the substrate between the source and the drain, wherein the source further comprises a pocket doping region having the second conductivity type under the gate, wherein the pocket doping region and the source doping region constitute a PN junction diode. The method comprises:

grounding the substrate and the source doping region;
applying a bit line voltage of about 3-10V to the drain doping region; and
applying a gate voltage of about 3-10V to the gate, wherein the bit line voltage applied to the drain doping region is coupled to the pocket doping region of the source, causing permanent damage to the PN junction diode and resulting in high reverse junction leakage.

According to some embodiments, the semiconductor memory device further comprises a gate dielectric layer disposed between the gate and the substrate, wherein a breakdown voltage of the gate dielectric layer is larger than a breakdown voltage of the PN junction diode.

According to some embodiments, the first conductivity type is P type and the second conductivity type is N type.

According to some embodiments, the source doping region is a $P^+$ doping region and the drain doping region is an $N^+$ doping region, and wherein the pocket doping region is an N-type doping region.

According to some embodiments, the source doping region is electrically connected to the substrate.

According to some embodiments, the source doping region has a junction depth that is deeper than that of the pocket doping region.

Another aspect of the invention provides a method for reading a semiconductor memory device. The semiconductor memory device comprises: a substrate having a first conductivity type; a source in the substrate, wherein the source comprises a source doping region having the first conductivity type; a drain in the substrate and spaced apart from the source, wherein the drain comprises a drain doping region having a second conductivity type opposite to the first conductivity type; and a gate disposed on the substrate between the source and the drain, wherein the source further comprises a pocket doping region having the second conductivity type under the gate, wherein the pocket doping region and the source doping region constitute a PN junction diode. The method comprises:

grounding the substrate and the source doping region;
applying a bit line voltage of about 0.5-1.5V to the drain doping region; and
applying a gate voltage of about 1-3V to the gate.

According to some embodiments, the semiconductor memory device further comprises a gate dielectric layer disposed between the gate and the substrate, wherein a breakdown voltage of the gate dielectric layer is larger than a breakdown voltage of the PN junction diode.

According to some embodiments, the first conductivity type is P type and the second conductivity type is N type.

According to some embodiments, the source doping region is a P+ doping region and the drain doping region is an N+ doping region, and wherein the pocket doping region is an N-type doping region.

According to some embodiments, the source doping region is electrically connected to the substrate.

According to some embodiments, the source doping region has a junction depth that is deeper than that of the pocket doping region.

Still another aspect of the invention provides a method for forming a semiconductor memory device. A substrate having a first conductivity type is provided. A source is formed in the substrate. The source comprises a source doping region having the first conductivity type. A drain is formed in the substrate and is spaced apart from the source. The drain comprises a drain doping region having a second conductivity type opposite to the first conductivity type. A gate is disposed on the substrate between the source and the drain. The source further comprises a pocket doping region having the second conductivity type under the gate, wherein the pocket doping region and the source doping region constitute a PN junction diode.

According to some embodiments, the method further comprises: forming a gate dielectric layer between the gate and the substrate, wherein a breakdown voltage of the gate dielectric layer is larger than a breakdown voltage of the PN junction diode.

According to some embodiments, the first conductivity type is P type and the second conductivity type is N type.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

It is to be noted that the following descriptions of preferred embodiments of this invention are presented herein for purposes of illustration and description only; it is not intended to be exhaustive or to be limited to the precise form disclosed.

The present invention pertains to a semiconductor memory device, such as a one-time programmable (OTP) memory cell (OTP memory cell or OTP cell), including a transistor and a diode. The transistor may be a planar MOS transistor, a Fin FET, a gate all around (GAA) transistor, etc. The diode is a PN junction diode. The OTP cell further comprises a substrate having a first conductivity type, and a source and a drain in the substrate. The source includes a source doping region having the first conductivity type. The drain includes a drain doping region having a second conductivity type opposite to the first conductivity type. A gate is disposed on the substrate between the source and the drain. The source further includes a pocket doping region having the second conductivity type under the gate. The pocket doping region and the source doping region constitute the PN junction diode.

Figure 1:
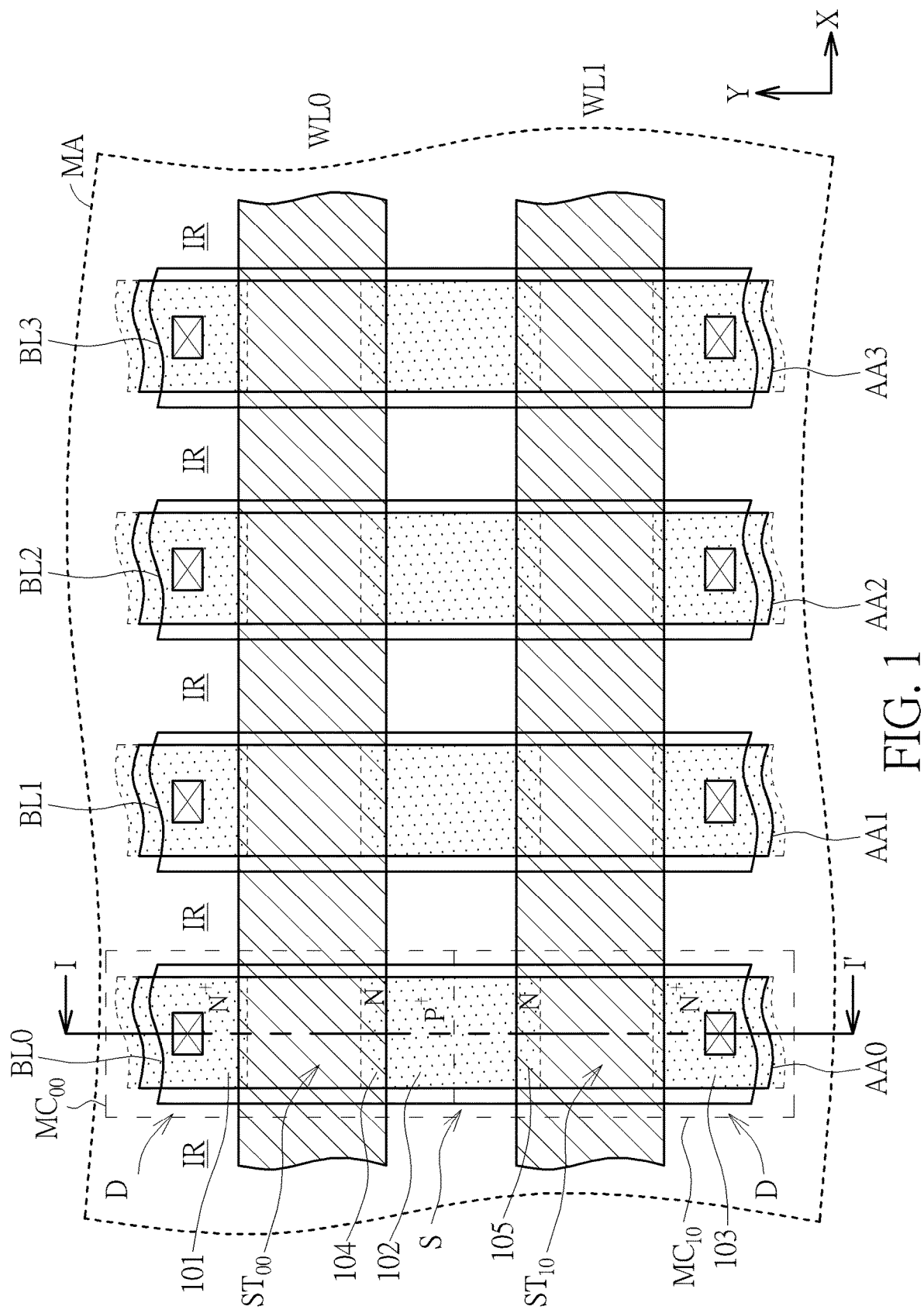
FIG. 1 is a layout diagram showing a 2×4 memory cell array according to an embodiment of the invention.
Figure 2:
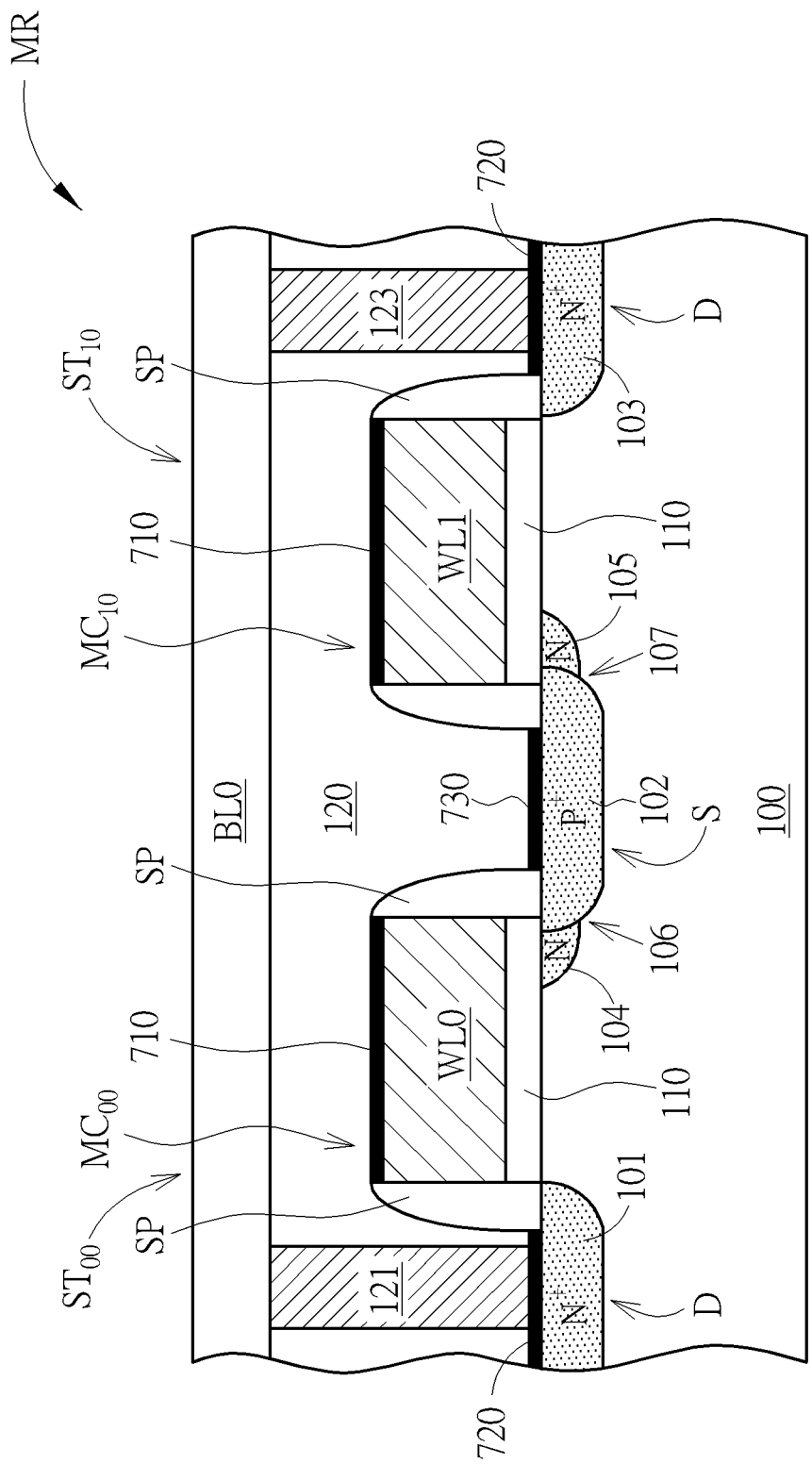
FIG. 2 is a sectional diagram taken along line I-I' in FIG. 1.
Figure 3:
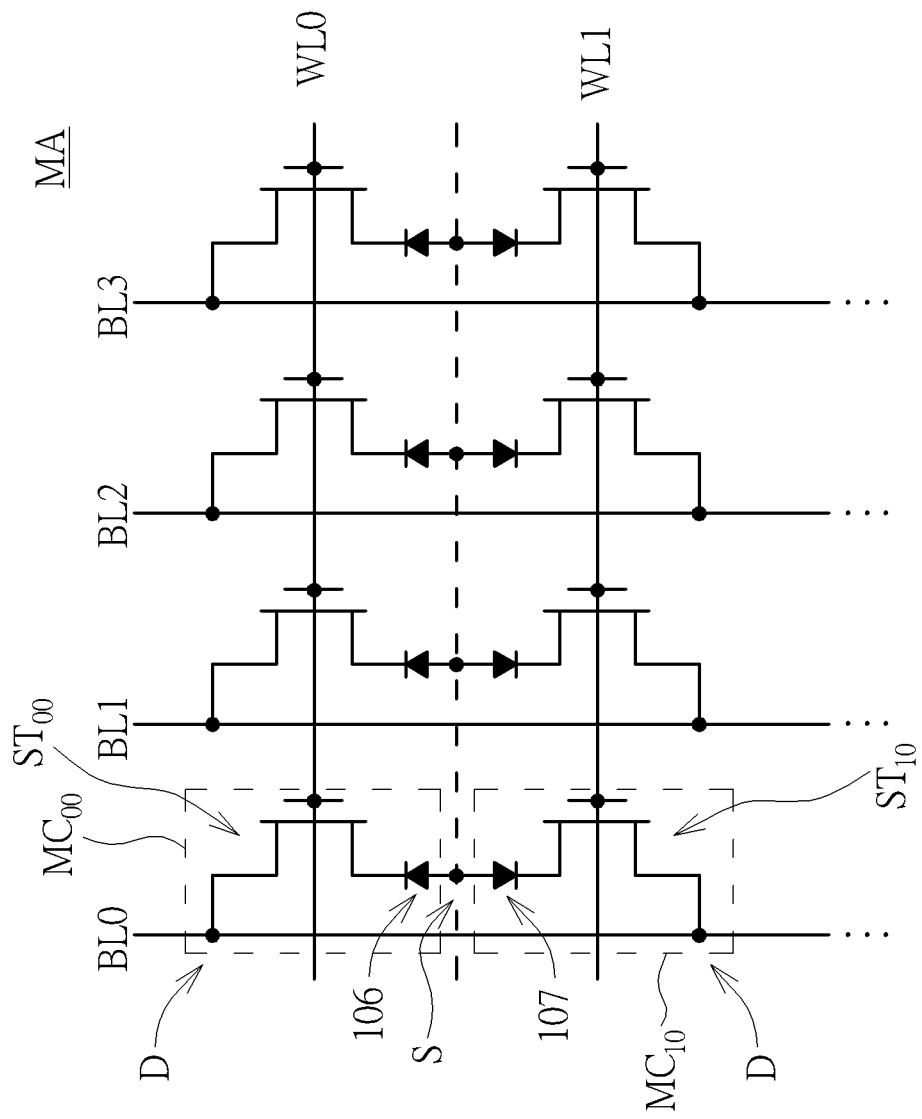
FIG. 3 is an equivalent circuit diagram of the 2×4 memory cell array in FIG. 1.

Please refer to FIG. 1 to FIG. 3. FIG. 1 is an exemplary layout diagram showing a 2×4 memory cell array according to an embodiment of the invention. FIG. 2 is a sectional diagram taken along line I-I' in FIG. 1. FIG. 3 is an equivalent circuit diagram of the 2×4 memory cell array in FIG. 1. As shown in FIG. 1 and FIG. 2, a substrate 100 having thereon a memory array area MA is provided. For the sake of simplicity, only a 2×4 memory cell array is illustrated in FIG. 1. According to an embodiment of the invention, the substrate 100 may comprise a semiconductor substrate including but not limited to a silicon substrate, a SiGe substrate, a SiC substrate or a silicon-on-insulator (SOI) substrate. The substrate 100 may have a first conductivity type such as P type, but is not limited thereto.

As can be seen in FIG. 1, a plurality of active areas, for example, four active areas AA0~AA3, are disposed on the substrate 100. According to an embodiment of the invention, each of the four active areas AA0~AA3 has a strip-shape and extends along a reference Y-axis direction. Each of the four active areas AA0~AA3 is surrounded by a trench isolation region IR. A plurality of gates or word lines, for example, two word lines WL0 and WL1, are disposed on the substrate 100. The two word lines WL0 and WL1 extend along the reference X-axis direction. The two word lines WL0 and WL1 traverse the four active areas AA0~AA3, thereby forming memory cells at the cross points of the word lines WL0 and WL1 and the four active areas AA0~AA3. For example, two memory cells $MC_{00}$ and $MC_{10}$ are formed at the cross points of the word lines WL0 and WL1 and the active area AA0.

According to an embodiment of the invention, the word line WL0 and the word line WL1 may comprise polysilicon, metal, metal alloy, or the like. A gate dielectric layer 110 is provided between the word line WL0 and the substrate 100 and between the word line WL1 and the substrate 100. According to an embodiment of the invention, a spacer SP may be provided on each sidewall of the word line WL0 and the word line WL1.

According to an embodiment of the invention, a source S is disposed in the active area AA0 between the word line WL0 and the word line WL1. That is, the source S is commonly shared by the neighboring memory cells $MC_{00}$ and $MC_{10}$. According to an embodiment of the invention, the memory cells $MC_{00}$ and $MC_{10}$ are mirror-symmetric with respect to the source S. On the other side of the word line WL0 and the word line WL1 opposite to the source S, a drain D is provided. According to an embodiment of the invention, for example, the drain D of the memory cell $MC_{00}$ comprises a drain doping region 101 having a second conductivity type such as N type. According to an embodiment of the invention, for example, the drain D of the memory cell $MC_{10}$ comprises a drain doping region 103 having the second conductivity type such as N type. According to an embodiment of the invention, for example, the drain doping region 101 and the drain doping region 103 may be an $N^+$ doping region.

According to an embodiment of the invention, the source S comprises a source doping region 102 having the first conductivity type such as P type. According to an embodiment of the invention, a pocket doping region 104 and a pocket doping region 105 having the second conductivity type such as N type are formed in the substrate 100 and are disposed adjacent to the source doping region 102. According to an embodiment of the invention, the source doping region 102 may be a $P^+$ doping region and is contiguous with the N-type pocket doping regions 104 and 105.

According to an embodiment of the invention, the source doping region 102 has a junction depth that is deeper than that of the pocket doping regions 104 and 105. Therefore, a bottom of the source doping region 102 is not surrounded by the pocket doping regions 104 or the pocket doping regions 105, and the source doping region 102 can be electrically connected to the substrate 100. That is, the bottom of the source doping region 102 is in direct contact with the bulk silicon portion of the substrate 100. In operation, the source doping region 102 and the substrate 100 are of the same voltage level, for example, ground.

According to an embodiment of the invention, the pocket doping regions 104 and 105 are situated directly under the word lines WL0 and WL1, respectively. The source doping region 102 and the pocket doping regions 104 and 105 constitute two PN junction diodes 106 and 107 on opposite sides of the source doping region 102. The two PN junction diodes 106 and 107 are located under the word line WL0 and the word line WL1, respectively. According to an embodiment of the invention, the word lines WL0, the drain D, and the source S constitute a select transistor $ST_{00}$. According to an embodiment of the invention, the word lines WL1, the drain D, and the source S constitute a select transistor $ST_{10}$.

Optionally, self-aligned silicide (SAC) layers 710, 720, and 730 such as titanium silicide, nickel silicide, cobalt silicide, tungsten silicide or the like, may be formed on the word lines WL0 and WL1 and the exposed top surfaces of the substrate 100, respectively.

According to an embodiment of the invention, the drain doping regions 101 and 103 are electrically connected to an overlying bit line BL0 that extends along the reference Y-axis direction. According to an embodiment of the invention, the bit line BL0 is electrically connected to the drain doping regions 101 and 103 through contact plugs 121 and 123, respectively, in an inter-layer dielectric (ILD) layer 120. According to an embodiment of the invention, as can be seen in FIG. 1, the bit line BL0 overlaps with the active area AA0, the bit line BL1 overlaps with the active area AA1, the bit line BL2 overlaps with the active area AA2, and the bit line BL3 overlaps with the active area AA3.

Figure 4:
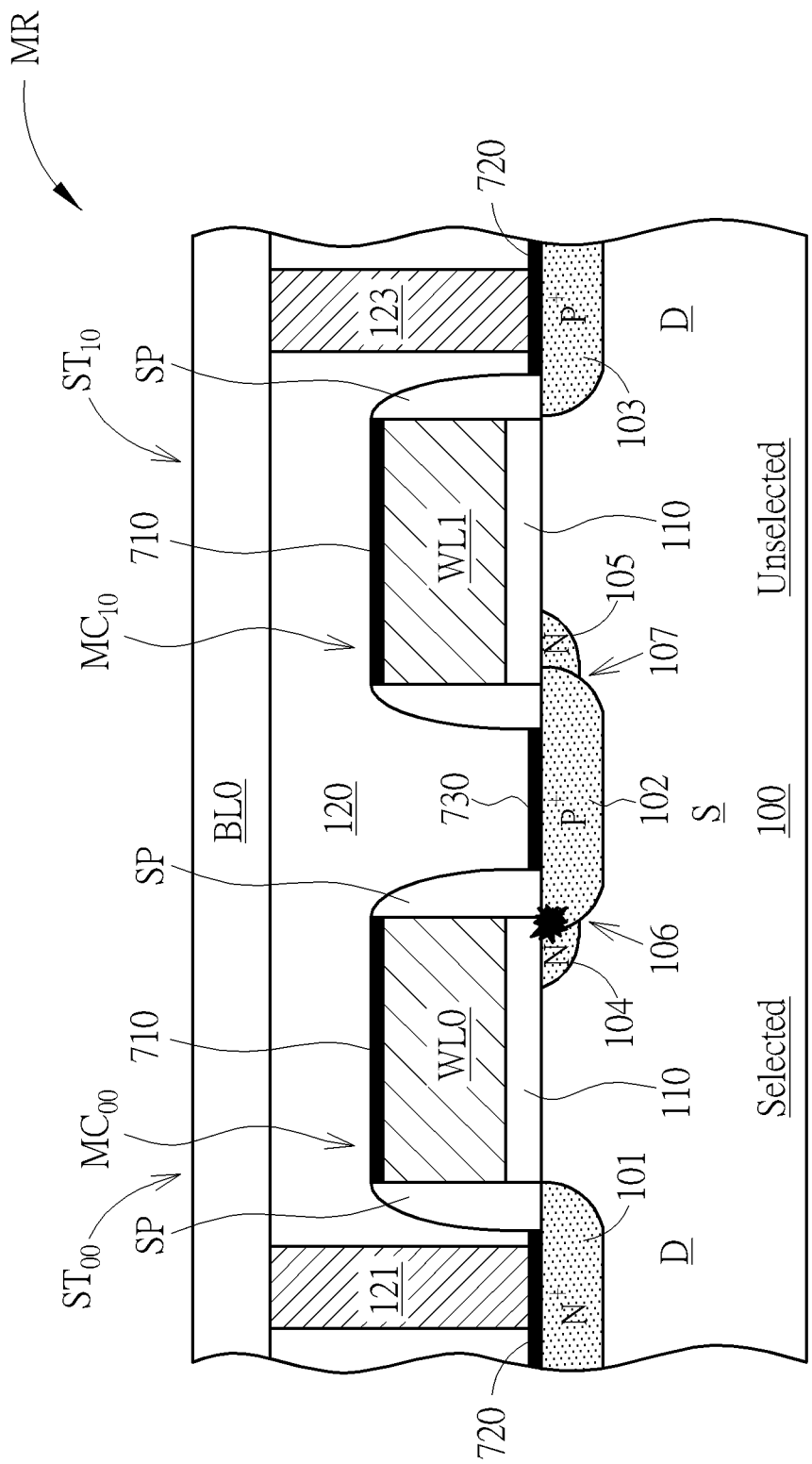
FIG. 4 is a sectional diagram showing the operation of the OTP memory device.

Please refer to Table 1 and FIG. 4. Table 1 shows the bias voltage conditions for operating the OTP memory device according to an embodiment of the invention. FIG. 4 is a sectional diagram showing the operation of the OTP memory device.

TABLE 1

|  | Program | Read |
|---|---|---|
| Selected WL | 3-10 V | 1-3 V |
| Unselected WL | 0 V | 0 V |
| Selected BL | 3-10 V | 0.5-1.5 V |
| Unselected BL | 0 V or floating | 0 V or floating |
| Substrate | 0 V | 0 V |

For example, during a program operation for programming the selected memory cell $MC_{00}$, the substrate 100 is grounded and the source doping region 104 is thus grounded. A bit line voltage $V_{BL}$=3-10V, which is higher than the breakdown voltage of the PN junction diode 106, is applied to the selected bit line BL0. A gate voltage or word line voltage $V_{WL}$=3-10V is applied to the selected word line WL0 to turn on the select transistor $ST_{00}$ of the selected memory cell $MC_{00}$. The unselected bit lines may be grounded or floating. The unselected word lines may be grounded. Under the above-described conditions, the bit line voltage $V_{BL}$ applied to the drain doping region 101 is coupled to the pocket doping region 104 of the source S, causing permanent damage to the PN junction diode 106 (reversed $N-P^+$ junction) and resulting in high reverse junction leakage. According to an embodiment of the invention, the breakdown voltage of the PN junction diode 106 is lower than a breakdown voltage of the gate dielectric layer 110 of the select transistor $ST_{00}$.

To read a selected memory cell $MC_{00}$, for example, a bit line voltage $V_{BL}$=0.5-1.5V is applied to the selected bit line BL0 and a word line voltage $V_{WL}$=1-3V is applied to the selected word line WL0. The unselected word lines and the substrate 100 are grounded (or 0V). The unselected bit lines may be 0V or floating. Since the memory cell MC00 has been programmed, there is a cell current flowing from the selected bit line BL0 to the pocket doping region 104, and then through the leaky $N-P^+$ junction to the substrate 100. Thus, the cell is in "1" state. On the other hand, the cell is in "0" state because the cell current is blocked by the reversed $N-P^+$ junction of the selected cell has not been programmed.

Figure 5:
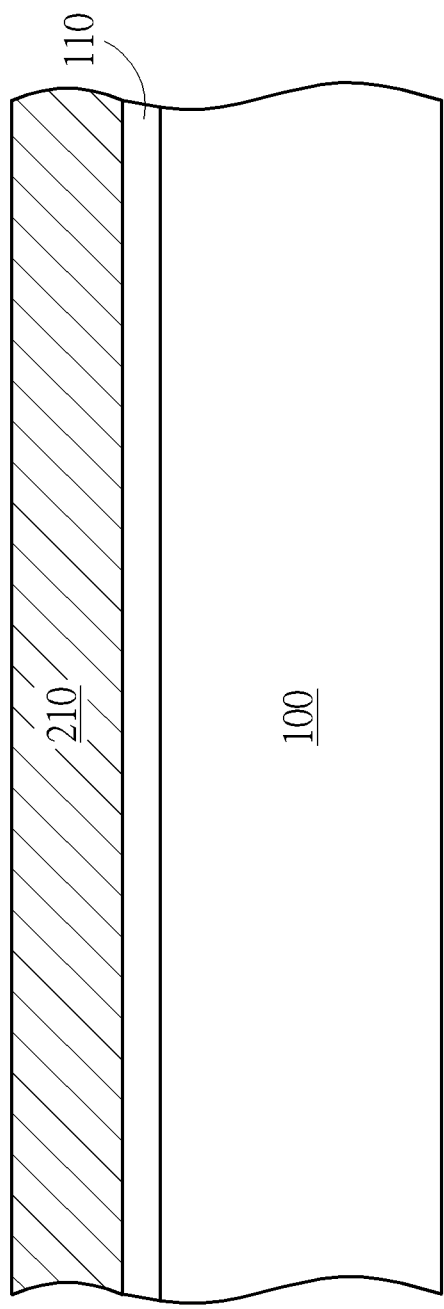
FIG. 5 to FIG. 10 are sectional diagrams showing a method for fabricating an OPT memory device according to an embodiment of the invention.

Please refer to FIG. 5 to FIG. 10. FIG. 5 to FIG. 10 are sectional diagrams showing a method for fabricating an OPT memory device according to an embodiment of the invention, wherein like regions, layers, or elements are designated by like numeral numbers or labels. As shown in FIG. 5, a substrate 100 is provided. According to an embodiment of the invention, the substrate 100 may comprise a semiconductor substrate including but not limited to a silicon substrate, a SiGe substrate, a SiC substrate or a silicon-on-insulator (SOI) substrate. According to another embodiment of the invention, the substrate 100 may comprise a P well in a triple well scheme. The substrate 100 may have a first conductivity type such as P type, but is not limited thereto. Shallow trench isolation (STI) process may be performed to define active areas on the substrate 100. Subsequently, a gate dielectric layer 110 including, but not limited to, a silicon oxide layer, a silicon oxynitride layer, a hafnium oxide layer or the like, is formed on the substrate 100. For example, the gate dielectric layer 110 may have a thickness of about 2-20 nm, but is not limited thereto.

Optionally, an ion implantation process for threshold voltage (Vth) adjustment may be carried out. For example, the aforesaid ion implantation process may be performed by implanting dopants such as boron or $BF_2$ with implant energy of about 10-20 KeV and a dose of about 1E12 to 1E13/cm². Subsequently, a gate electrode layer 210 is formed on the gate dielectric layer 110. According to an embodiment of the invention, the gate electrode layer 210 may comprise N doped polysilicon, silicide, metal or the like, but is not limited thereto. According to an embodiment of the invention, for example, the gate electrode layer 210 may have a thickness of about 80-150 nm.

Figure 6:
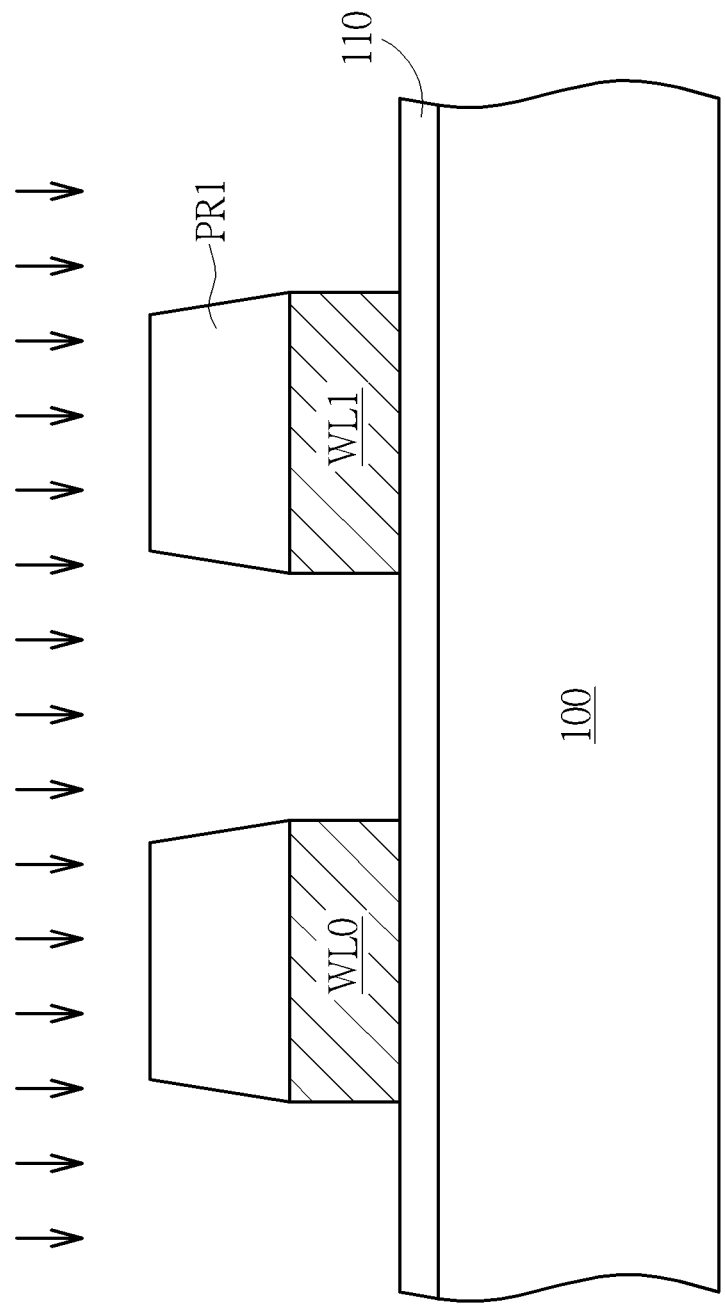

As shown in FIG. 6, a first photoresist pattern PR1 is formed on the gate electrode layer 210 to define word lines (or gates). The formation of the first photoresist pattern PR1 may include, but not limited to, photoresist coating, baking, exposure, and developing. Subsequently, an anisotropic dry etching process is carried out to remove the gate electrode layer 210 not covered by the first photoresist pattern PR1, thereby forming word lines (or gates), for example, word lines WL0 and WL1. The first photoresist pattern PR1 is then stripped off.

Figure 7:
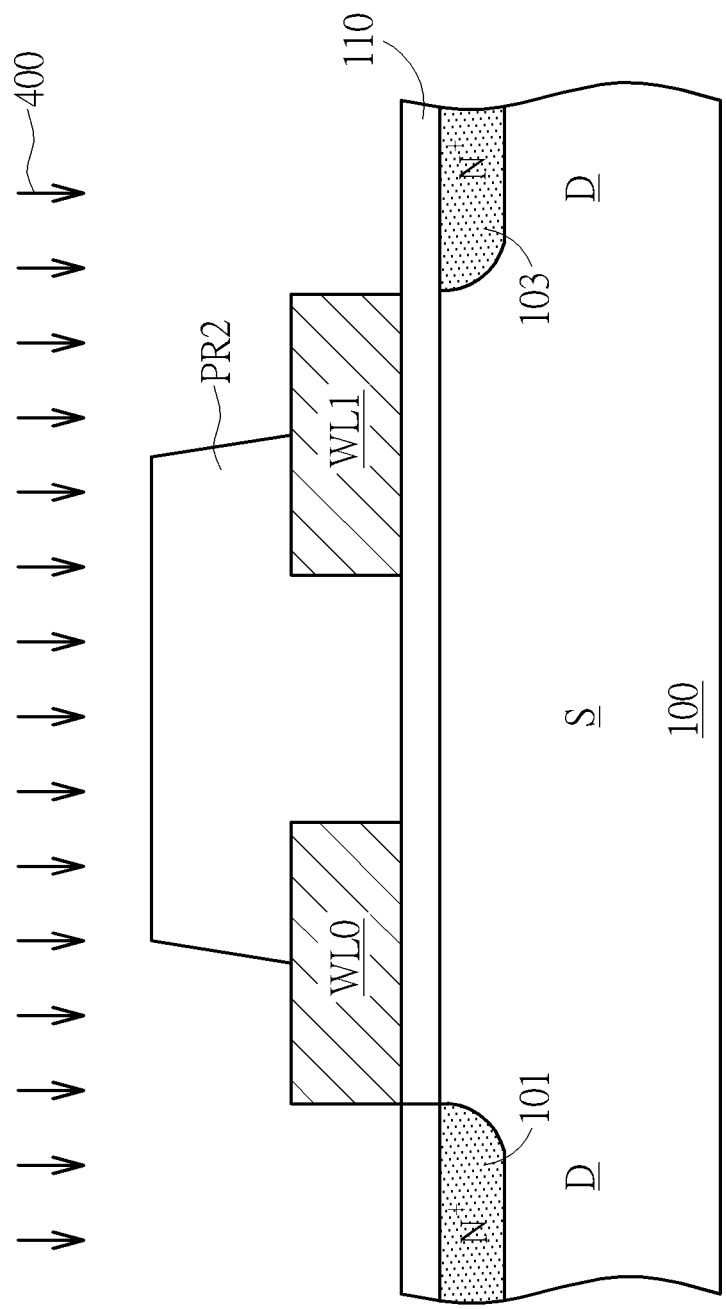

As shown in FIG. 7, a second photoresist pattern PR2 is formed on the substrate 100. The second photoresist pattern PR2 covers the source regions of the memory cells in the memory array area. The drain regions of the memory cells in the memory array area are exposed. The formation of the second photoresist pattern PR2 may include, but not limited to, photoresist coating, baking, exposure, and developing. Subsequently, an ion implantation process 400 is performed to form drain doping regions 101 and 103 in the substrate 100. According to another embodiment of the invention, the drain doping regions 101 and 103 are $N^+$ doping regions. According to another embodiment of the invention, the drain doping regions 101 and 103 may have graded junctions for higher junction breakdown voltage. To form such graded junctions, a doubly diffused method may be used. For example, dopants such as phosphorus may be implanted into the substrate 100 with an energy of about 30-40 KeV and a dose of about $5E12-5E13/cm^2$ and arsenic may be implanted into the substrate 100 with an energy of about 15-30 KeV and a dose of about $1E15-5E15/cm^2$. The second photoresist pattern PR2 is then stripped off, followed by optional rapid thermal anneal or furnace anneal.

Figure 8:
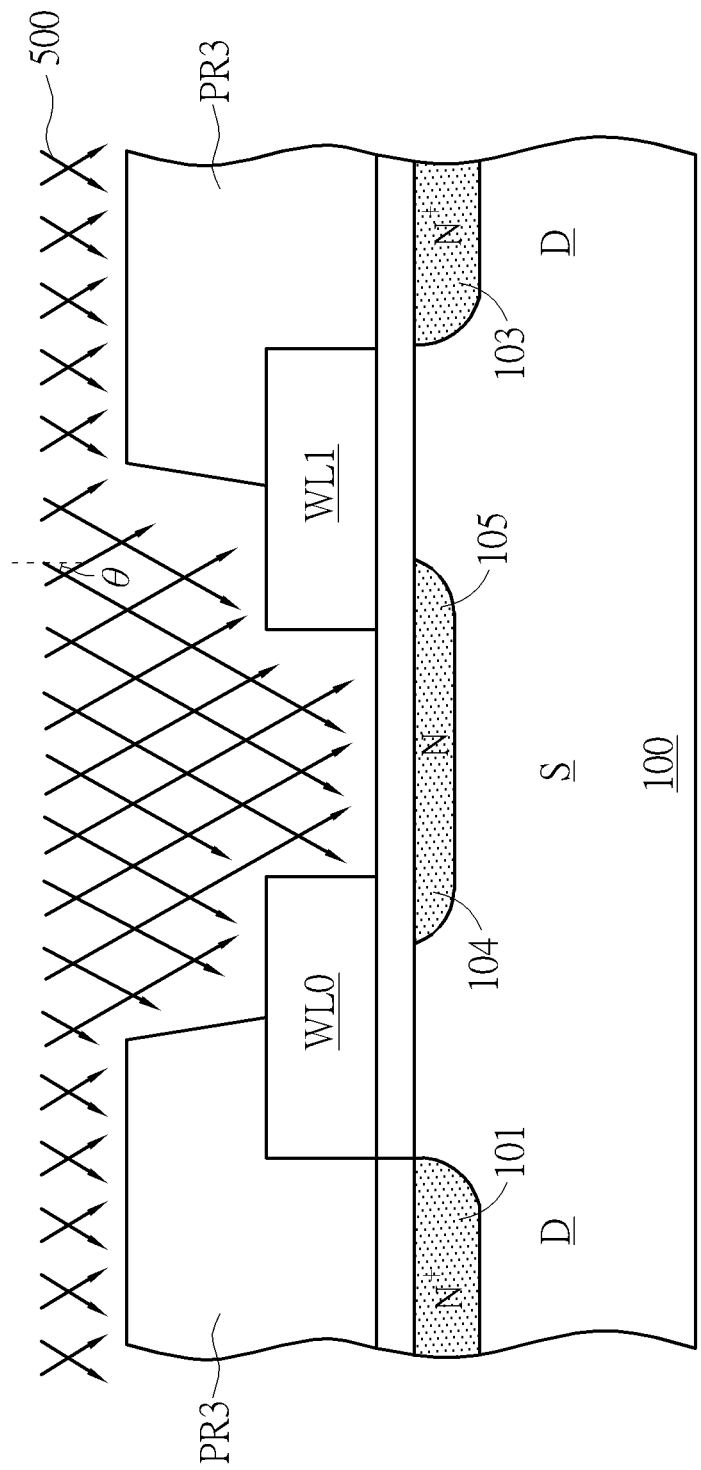

As shown in FIG. 8, a third photoresist pattern PR3 is formed on the substrate 100. The third photoresist pattern PR3 masks the drain regions of the memory cells in the memory array area. The source regions of the memory cells in the memory array area are exposed. The third photoresist pattern PR3 may partially overlap with the word lines WL0 and WL1. The formation of the third photoresist pattern PR3 may include, but not limited to, photoresist coating, baking, exposure, and developing. Subsequently, an ion implantation process 500 is performed to form pocket doping regions 104 and 105 in the substrate 100. According to another embodiment of the invention, the pocket doping regions 104 and 105 are N type doping regions. The pocket doping region 104 is located under the word line WL0 and the pocket doping region 105 is located under the word line WL1. The ion implantation process 500 is a tilt-angle two-way ion implantation process that may be performed at a tile angle θ of about 20-70 degrees. For example, dopants such as phosphorus or arsenic may be implanted into the substrate 100 with an energy of about 15-50 KeV and a dose of about $5E13-5E14/cm^2$.

Figure 9:
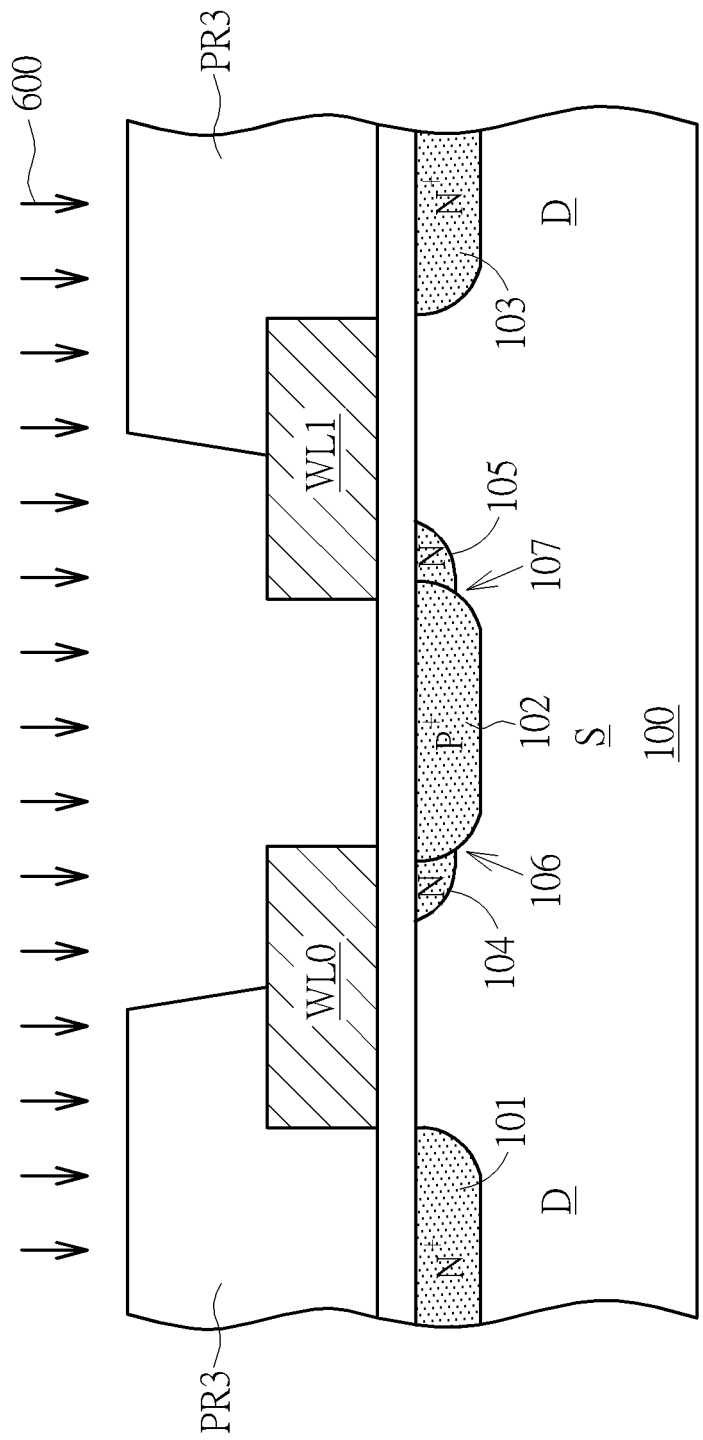

As shown in FIG. 9, subsequently, an ion implantation process 600 is performed to form source doping region 102 in the substrate 100. The source doping region 102 has a junction depth that is deeper than that of the pocket doping regions 104 and 105. Therefore, a bottom of the source doping region 102 is not surrounded by the pocket doping regions 104 or the pocket doping regions 105, and the source doping region 102 is directly connected to the substrate 100.

Optionally, the ion implantation process 600 can be performed prior to the pocket implantation process 500. According to another embodiment of the invention, the source doping region 102 is a $P^+$ doping region. For example, dopants such as boron or $BF_2$ may be implanted into the substrate 100 with an energy of about 10-30 KeV and a dose of about $1E15-5E15/cm^2$, followed by PR3 removal and then rapid thermal anneal or furnace anneal treatment. The source doping region 102 and the pocket doping regions 104 and 105 constitute two PN junction diodes 106 and 107 on opposite sides of the source doping region 102. The two PN junction diodes 106 and 107 are located under the word line WL0 and the word line WL1, respectively.

Figure 10:
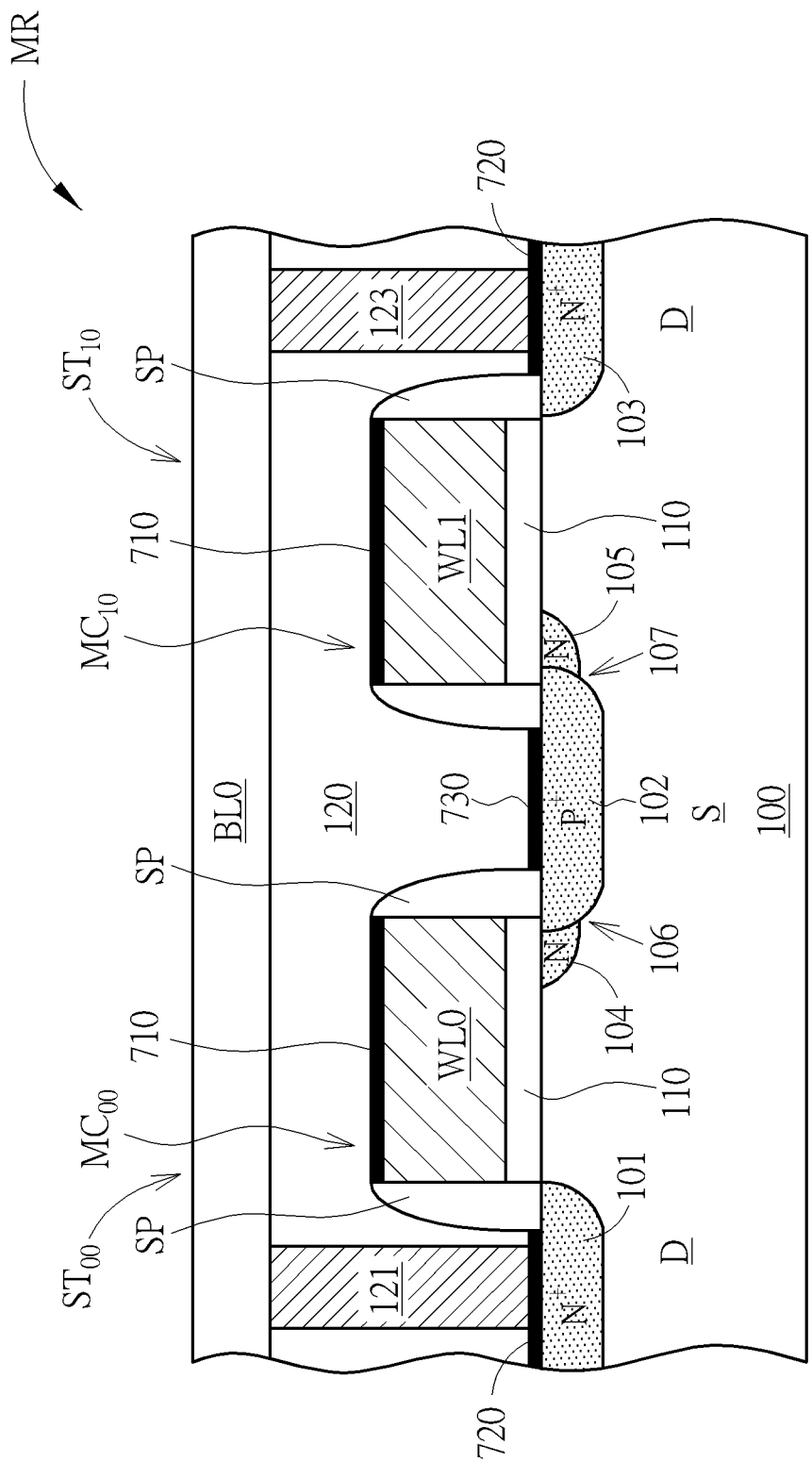

As shown in FIG. 10, optionally, spacers SP such as silicon nitride or silicon oxide spacers may be formed on the sidewalls of the word lines WL0 and WL1. Subsequently, self-aligned silicide (SAC) layers 710, 720, and 730 such as titanium silicide, nickel silicide, cobalt silicide, tungsten silicide or the like, are formed on the word lines WL0 and WL1 and the exposed top surfaces of the substrate 100, respectively. According to another embodiment of the invention, the SAC layers 730 on the source doping region 102 may be omitted. Subsequently, an inter-layer dielectric (ILD) layer 120 is deposited on the substrate 100 in a blanket manner. Optionally, the ILD layer 120 such as a silicon oxide layer may be subjected to a planarization process such as a chemical mechanical polishing (CMP) process. Contact plugs 121 and 123 such as tungsten plugs are then formed in the ILD layer 120 on the drain doping regions 101 and 103, respectively. Metal bit lines are then formed on the ILD layer 120 and are electrically connected to the contact plugs 121 and 123.

To sum up, the OTP memory cell $MC_{00}$ includes a substrate 100 having a first conductivity type, for example, P type, and a source S and a drain D in the substrate 100. The source S includes a source doping region 102 having the first conductivity type ($P^+$). The drain D includes a drain doping region 101 having a second conductivity type, for example, N type. A gate or word line WL0 is disposed on the substrate 100 between the source S and the drain D. The source S further includes a pocket doping region 104 having the second conductivity type (N type) under the gate or word line WL0. The pocket doping region 104 and the source doping region 102 constitute a PN junction diode 106. In program operation, the bit line voltage $V_{BL}$ applied to the drain doping region 101 is coupled to the pocket doping region 104 of the source S, causing permanent damage to the PN junction diode 106 (reversed $N-P^+$ junction) and resulting in high reverse junction leakage. It is advantageous to use the present invention because the memory array has compact layout and small memory cell size. The 1T1D OTP memory device has simple circuit and is easy to manufacture.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor memory device, comprising:
at lease a one-time programmable (OTP) cell, wherein the OTP cell comprises a transistor and a diode, wherein the diode is a PN junction diode that is electrically coupled to a source of the transistor;

a substrate having a first conductivity type, wherein the source is disposed in the substrate and comprises a source doping region having the first conductivity type;

a drain in the substrate and spaced apart from the source, wherein the drain comprises a drain doping region having a second conductivity type opposite to the first conductivity type;

a gate disposed on the substrate between the source and the drain, wherein the source further comprises a pocket doping region having the second conductivity type under the gate, wherein the pocket doping region and the source doping region constitute the PN junction diode; and a gate dielectric layer disposed between the gate and the substrate, wherein a breakdown voltage of the gate dielectric layer is higher than a breakdown voltage of the PN junction diode.

2. The semiconductor memory device according to claim 1, wherein the first conductivity type is P type and the second conductivity type is N type.

3. The semiconductor memory device according to claim 2, wherein the source doping region is a $P^+$ doping region and the drain doping region is an $N^+$ doping region, and wherein the pocket doping region is an N-type doping region.

4. The semiconductor memory device according to claim 1, wherein the drain doping region is electrically connected to a bit line, and wherein the source doping region is electrically connected to the substrate.

5. The semiconductor memory device according to claim 1, wherein the source doping region has a junction depth that is deeper than that of the pocket doping region.

6. A method for programming digital "1" to the OTP cell according to claim 1, further comprising:

grounding the substrate and the source doping region;

applying a bit line voltage to the drain doping region; and applying a gate voltage to the gate, wherein the bit line voltage applied to the drain doping region is coupled to the pocket doping region of the source, causing permanent damage to the PN junction diode and resulting in high reverse junction leakage.

7. The method according to claim 6, wherein the bit line voltage is about 3-10V, and the gate voltage is about 3-10V.

8. A method for reading the OTP cell according to claim 1 comprising:

grounding the substrate and the source doping region;

applying a bit line voltage to the drain doping region; and applying a gate voltage to the gate.

9. The method according to claim 8, wherein the bit line voltage is about 0.5-1.5V, and the gate voltage is about 1-3V.

10. A method for forming a semiconductor memory device, comprising:

providing a substrate having a first conductivity type;

forming a source in the substrate, wherein the source comprises a source doping region having the first conductivity type;

forming a drain in the substrate, wherein the drain is spaced apart from the source and comprises a drain doping region having a second conductivity type opposite to the first conductivity type; and forming a gate on the substrate between the source and the drain, wherein the source further comprises a pocket doping region having the second conductivity type under the gate, wherein the pocket doping region and the source doping region constitute a PN junction diode; and forming a gate dielectric layer between the gate and the substrate, wherein a breakdown voltage of the gate dielectric layer is larger than a breakdown voltage of the PN junction diode.

11. The method according to claim 10, wherein the first conductivity type is P type and the second conductivity type is N type.

12. The method according to claim 10, wherein the drain is formed by using a doubly diffused method.

13. The method according to claim 12, wherein the doubly diffused method comprises:

implanting phosphorus into the substrate with an energy of about 30-40 KeV and a dose of about 5E12-5E13/cm$^2$; and implanting arsenic into the substrate with an energy of about 15-30 KeV and a dose of about 1E15-5E15/cm$^2$.

14. The method according to claim 10, wherein the pocket doping region is formed by using a tilt-angle ion implantation process performed at a tile angle θ of about 20-70 degrees.

15. The method according to claim 14, wherein the tilt-angle ion implantation process comprises:

implanting phosphorus or arsenic into the substrate with an energy of about 15-50 KeV and a dose of about 5E13-5E14/cm$^2$.

16. The method according to claim 10, wherein the source doping region is a $P^+$ doping region, and wherein the source doping region has a junction depth that is deeper than that of the pocket doping region, and the source doping region is directly connected to the substrate.

17. The method according to claim 16, wherein the $P^+$ doping region is formed by implanting boron or $BF_2$ into the substrate with an energy of about 10-30 KeV and a dose of about 1E15-5E15/cm$^2$.

* * * * *